(12) United States Patent
Lin

(10) Patent No.: US 9,386,719 B2
(45) Date of Patent: Jul. 5, 2016

(54) FIXING STRUCTURE APPLICABLE TO MULTIPLE SIZES OF STORAGE DEVICE

(71) Applicant: CREMAX TECH CO., LTD., New Taipei (TW)

(72) Inventor: Chien-Chung Lin, New Taipei (TW)

(73) Assignee: CREMAX TECH CO., LTD., New Taipei (TW)

( * ) Notice: Subject to any disclaimer, the term of this patent is extended or adjusted under 35 U.S.C. 154(b) by 39 days.

(21) Appl. No.: 14/525,173

(22) Filed: Oct. 27, 2014

(65) Prior Publication Data

US 2016/0120055 A1    Apr. 28, 2016

(51) Int. Cl.
| | |
|---|---|
| *H05K 7/14* | (2006.01) |
| *H05K 5/00* | (2006.01) |
| *H05K 5/02* | (2006.01) |
| *H05K 7/18* | (2006.01) |

(52) U.S. Cl.
CPC ............... *H05K 7/14* (2013.01); *H05K 5/0021* (2013.01); *H05K 5/0217* (2013.01); *H05K 7/183* (2013.01)

(58) Field of Classification Search
CPC ......... H05K 7/14; H05K 7/12; H05K 7/1401; H05K 7/1404; H05K 7/1411; H05K 5/0217
See application file for complete search history.

(56) References Cited

U.S. PATENT DOCUMENTS

| | | | | |
|---|---|---|---|---|
| 5,765,933 A * | 6/1998 | Paul | ................... | H01R 13/6335 312/223.1 |
| 6,450,597 B1 * | 9/2002 | Bell | ........................ | G06F 1/181 211/41.12 |
| 6,661,677 B1 * | 12/2003 | Rumney | ............... | G11B 33/128 174/377 |
| 6,666,414 B2 * | 12/2003 | Dean | .................... | G11B 33/124 248/27.1 |
| 8,009,425 B2 * | 8/2011 | Kang | ....................... | G06F 1/181 248/27.3 |
| 8,405,968 B2 * | 3/2013 | Chen | ........................ | H05K 7/14 211/26 |
| 8,919,895 B2 * | 12/2014 | Lin | ...................... | G11B 33/124 312/223.2 |
| 2003/0067753 A1 * | 4/2003 | Kao | ...................... | H05K 7/1411 361/759 |

* cited by examiner

*Primary Examiner* — Daniel Rohrhoff
(74) *Attorney, Agent, or Firm* — Leong C. Lei

(57) ABSTRACT

A fixing structure applicable to multiple sizes of storage device includes an enclosure, which has an interior forming an accommodation space that receives a storage device of one of the multiple sizes to be inserted into the enclosure. The enclosure includes, in an upper portion of the interior thereof, at least one spring-biasing section, which applies a spring force to an upper surface of the storage device opposite thereto for positioning in a longitudinal direction. The enclosure includes therein positioning sections and retention sections respectively set on opposite lateral sides thereof for cooperating with lateral sides of the storage device for positioning in a lateral direction. A lid has an inside surface on which a supporting section is formed so that when the lid is mounted to and closing a front side of the enclosure, the supporting section is in engagement with the storage device to secure the storage device.

2 Claims, 5 Drawing Sheets

FIXING STRUCTURE APPLICABLE TO MULTIPLE SIZES OF STORAGE DEVICE

BACKGROUND OF THE INVENTION (a) Technical Field of the Invention

The present invention generally relates to a fixing structure applicable to multiple sizes of storage device, and more particularly to a fixing structure comprising an enclosure having an interior forming an accommodation space, which when used in combination with structural arrangement provided therein, is capable of accommodating storage devices of different sizes therein and a lid connected to the enclosure to allow for easy insertion of a storage device into the enclosure to achieve a fixed condition between a connector mounted inside the enclosure and the storage device so as to prevent damages resulting from influences of external forces.

(b) Description of the Prior Art

Storage devices that are classified as 2.5" hard disk drives include solid-state drives (SSDs) and traditional hard disk drives (HDDs) and may have multiple sizes of thickness between 7 to 15 millimeters. Most of the old fashion enclosures generally provide no space for accommodating a 2.5" hard disk drive. A user has to purchases an additional hard disk rack or an adaption device that is generally capable of accommodating various sizes of different types of 2.5" hard disk drive and screws are commonly needed for fixing the 2.5" hard disk drive to such a device for being converted into an outline size equivalent to a 3.5" hard disk drive for being installed in a 3.5" hard disk rack. This is surely inconvenient.

Some later developed devices overcome such problems by providing a hard disk fixing rack that requires no fastening with screws and can support multiple sizes of 2.5" hard disk drives. However, these devices do not allow for securely fixing of the hard disk drives therein primarily due to hard disk drives of different sizes are retained in position through being biased by springs in combination with accessories, which allows for expansion of the applicable range to hard disk drive sizes. This arrangement, however, is easily affected by external forces to get detached or shifted in position, eventually leading to the damage of components that are electrically connected to or even the hard disk drive itself. Further, a long term use would readily causes elastic fatigue of the spring, making it losing the function thereof. Thus, it is desired to have a design that allows for securely fixing a hard disk drive, has excellent durability, and is convenient to use.

SUMMARY OF THE INVENTION

The present invention provides a fixing structure applicable to multiple sizes of storage device for overcoming the above problems and generally comprising an integrally-formed unitary enclosure that has an interior space that defines therein an accommodation for receiving insertion of multiple sizes of storage device therein to be connected to and positioned by a connector arranged inside and at a rear side of the enclosure. The enclosure comprises, in an upper portion of the interior thereof at least one spring-biasing section that elastically engages and abuts the storage device to position the storage device in a longitudinal direction. The enclosure includes, at left and right lateral sides of the interior thereof, a pair of positioning sections and a pair of retention sections, which help position the storage device in a lateral direction according to the thickness of the storage device. A lid is provided to correspond to and connect with a front side of the enclosure so that an elastic supporting section that is provided on an inside surface of the lid helps accommodate storage devices of different thickness sizes (which is between 7-15 millimeter), allowing for easy insertion of the storage device into the enclosure to set a connector mounted inside the enclosure and the storage device in a fixed condition for preventing damages resulting from influences of external forces.

Compared to the techniques of the prior art, the present invention uses various coupling structure to allow an accommodation space formed in the interior of an enclosure to receive a storage device of one of multiple sizes to be inserted into and positioned in the enclosure, allowing the storage device to be fixed easily and not to be affected by external forces. Further, with a supporting section of a lid securely holding the storage device, the storage device and the connector mounted inside the enclosure are protected against influences of external forces and the best use of the interior space can be achieved.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
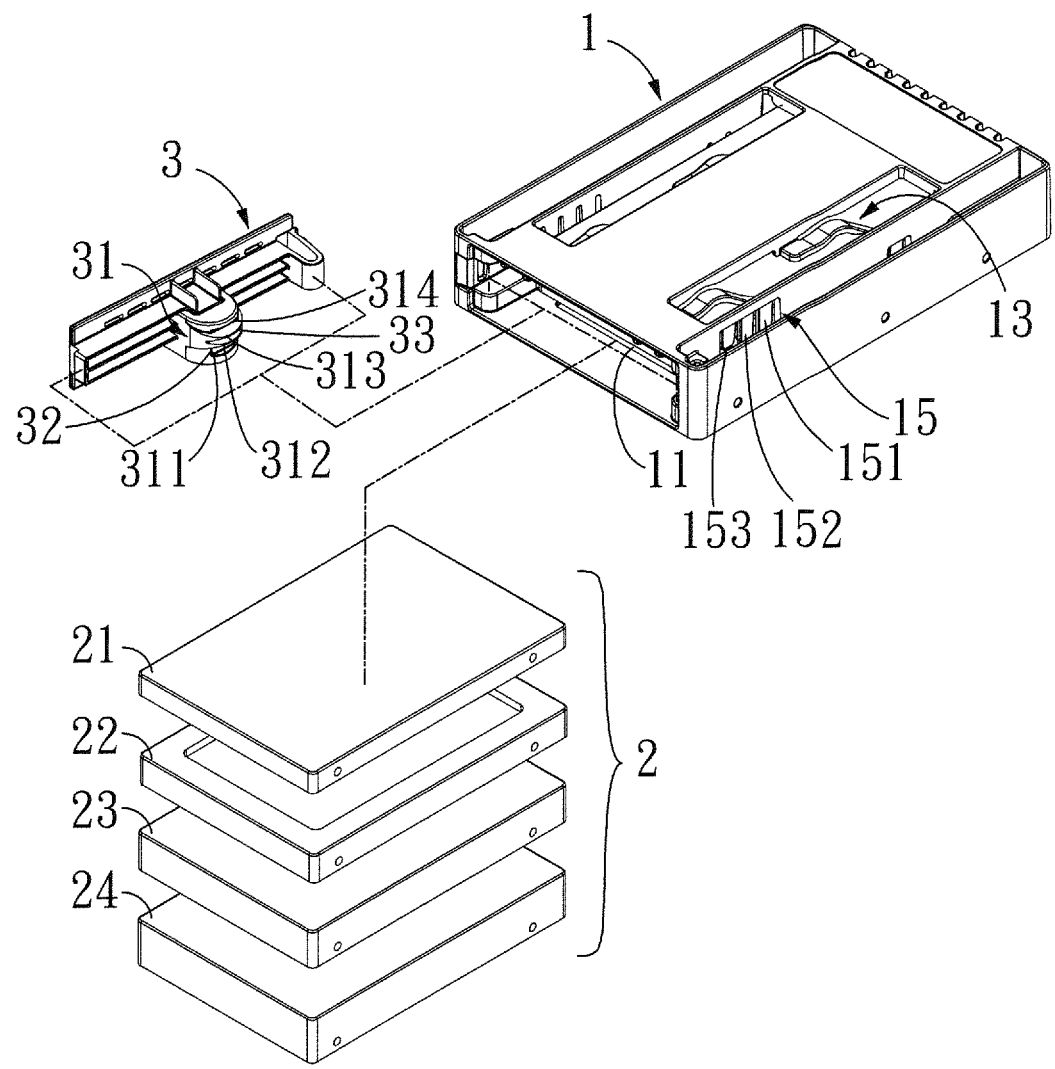
FIG. 1 is a perspective view of the present invention.
Figure 2:
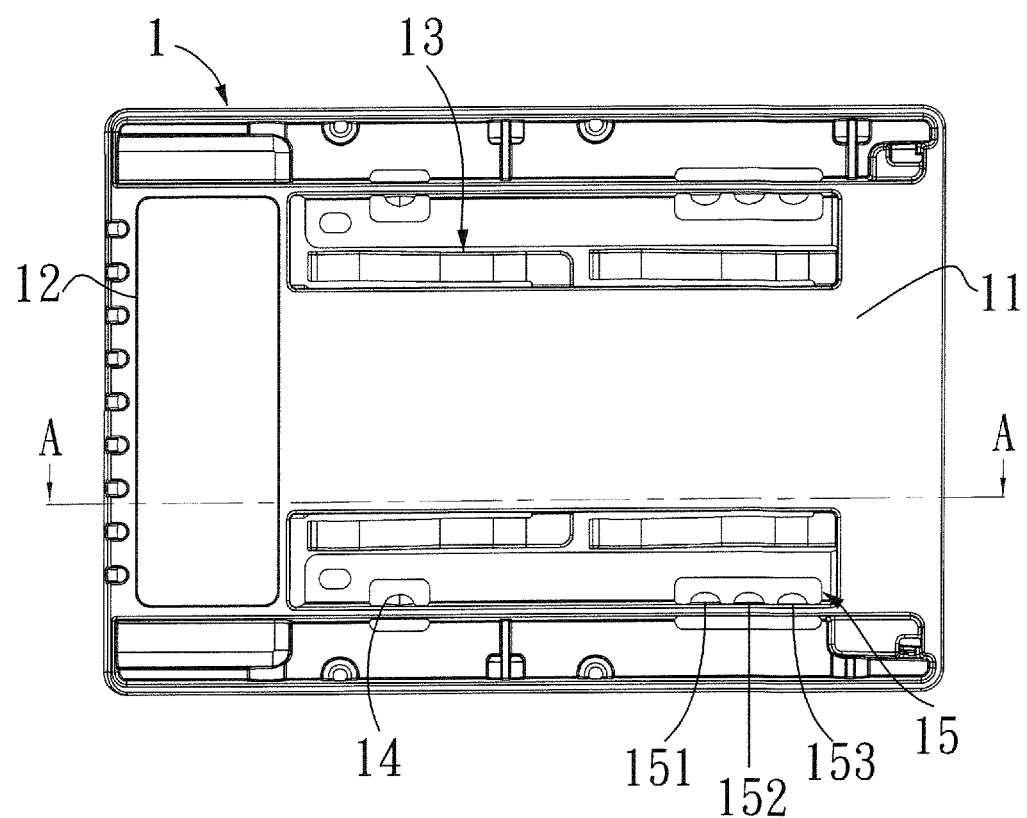
FIG. 2 is a top plan view of the present invention.
Figure 3:
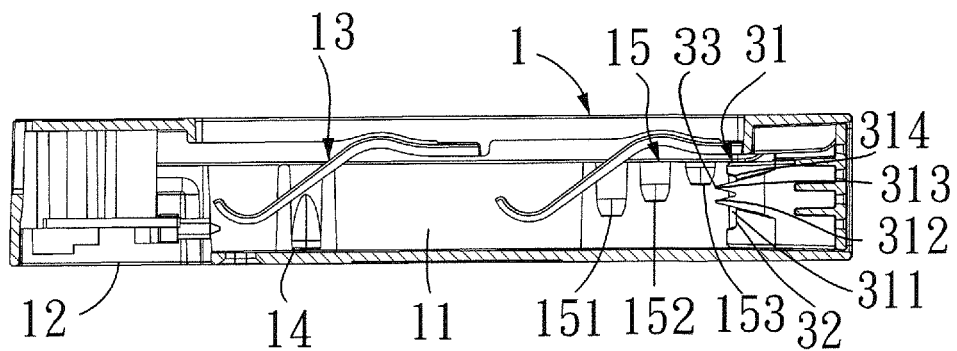
FIG. 3 is a cross-sectional view of the present invention taken along line A-A, illustrating a condition where no storage device is inserted therein.
Figure 4:
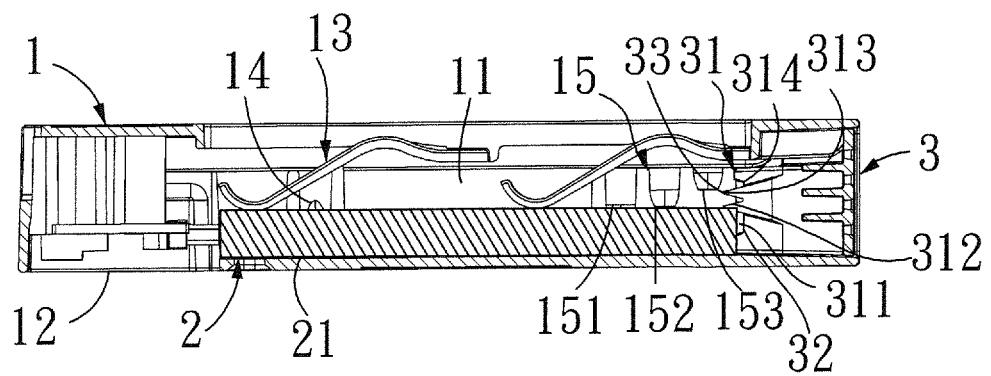
FIG. 4 is a cross-sectional view of the present invention taken along line A-A, illustrating a condition where a storage device of a solid-state drive A is inserted therein.
Figure 5:
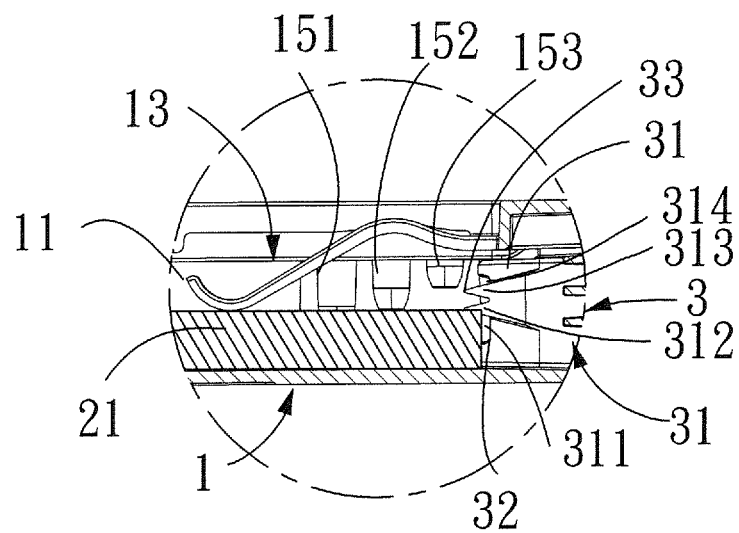
FIG. 5 is a schematic view, in an enlarged form, showing a portion of a storage device of a solid-state drive A according to the present invention.
Figure 6:
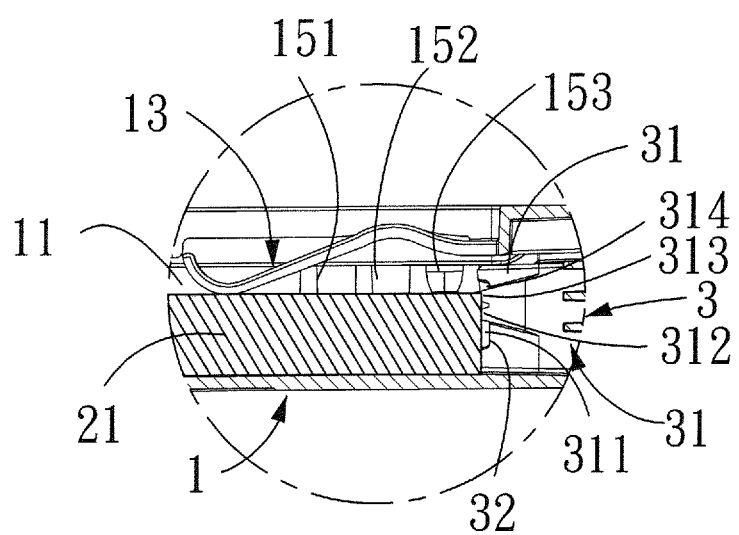
FIG. 6 is a schematic view, in an enlarged form, showing a portion of a storage device of a solid-state drive B according to the present invention.
Figure 7:
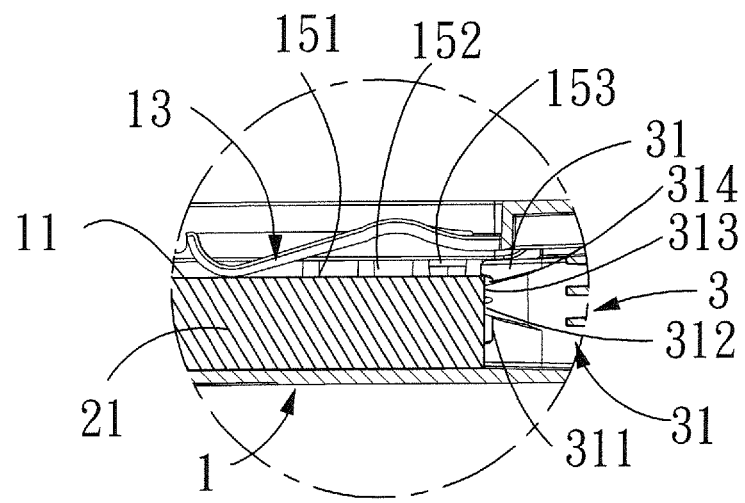
FIG. 7 is a schematic view, in an enlarged form, showing a portion of a storage device of a solid-state drive C according to the present invention.
Figure 8:
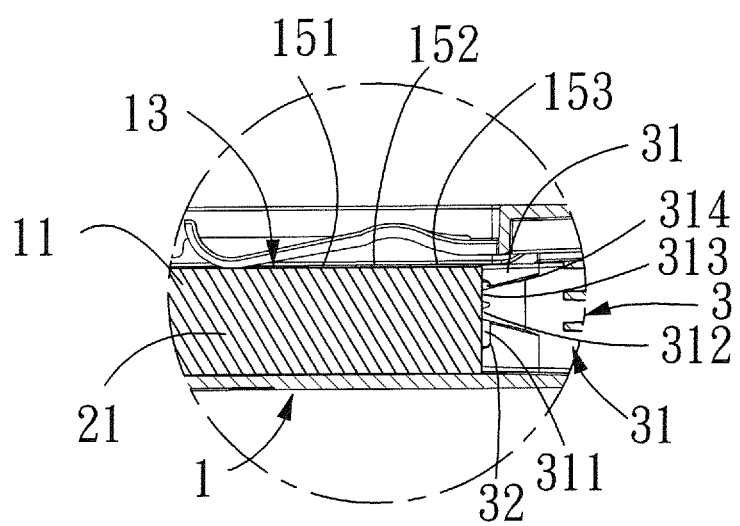
FIG. 8 is a schematic view, in an enlarged form, showing a portion of a storage device of a solid-state drive D according to the present invention.

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

The present invention will be described in detail with reference to an available preferred embodiment, in combination with the attached drawings, as follows for the purposes of better understanding of the present invention. Referring to FIGS. 1-8, the present invention provides a fixing structure applicable to multiple sizes of storage device, comprising an enclosure (1), which is integrally formed through injection molding of plastics. The enclosure (1) is provided generally for conversion of a 2.5" hard disk drive that is commercially available in the market to a 3.5" hard disk drive to be installed in and used with an enclosure of a desktop computer. The enclosure (1) has an interior in which an accommodation space (11) is formed. The accommodation space (11) allows for insertion of a storage device (2) of one of multiple sizes therein. The enclosure (1) comprises a connector (12) arranged therein and mounted to a rear side thereof. When the storage device (2) is inserted into the accommodation space (11), the connector (12) is arranged to electrically connect the storage device (2) in such a way that a rear end of the storage device (2) is fixed to the rear side of the enclosure (1). The enclosure (1) further comprises at least one spring-biasing section (13) arranged at an upper portion of the interior space thereof. The spring-biasing section (13) is arranged to oppose an upper surface of the storage device (2) so as to apply a downward spring force to the storage device (2) for positioning in a longitudinal direction. The enclosure (1) comprises therein a pair of positioning sections (14) and a pair of retention sections (15), both being respectively set at opposite left and right later sides to cooperate with left and right lateral sides of the storage device (2) for positioning in a lateral direction. A lid (3) has an inside surface on which a supporting section (31) is provided. The lid (3) is mountable to and closes a front side of the enclosure (1) to have the supporting section (31) in engagement with the storage device (2) so as to have the storage device (2) completely secured in the interior of the enclosure (1).

Referring to FIGS. 1-4, in the embodiment illustrated, the enclosure (1) comprises fours spring-biasing sections (13) arranged in an upper portion thereof in a symmetrical manner and showing elasticity for partial deflectability, whereby when the storage device (2) is positioned in the accommodation space (11), the spring-biasing sections (13) apply uniformly distributed spring forces to the top of the storage device (2) for positioning in the longitudinal direction. As mentioned previously, the storage device (2) is generally a solid-state drive (SSD) or a traditional hard disk drive (HDD) having a thickness size between 7-15 millimeters, which will be collectively referred to here in as "hard disk drives". The thickness dimensions can be further divided into a size of 7.0 mm for hard disk drive A (21), 9.5 mm for hard disk drive B (22), 12.5 mm for hard disk drive C (23), and 15.0 mm for hard disk drive D (24). Since these types of hard disk drives A-D are of different thicknesses, the enclosure (1) is provided therein, at two opposite lateral sides, with a pair of positioning sections (14) and a pair of retention sections (15). Due to the consideration of connection and positioning of the rear end of the storage device (2) with and by the connector (12), the positioning sections (14) are provided for cooperation with the portions of the two lateral sides of the storage device (2) that are closed to the rear end to assist the retention sections (15) that are provided for a front portion of the storage device (2). Such an arrangement of the positioning sections (14) is for the purposes that when it is intended to dismount and replace the storage device (2), a force can applied to the storage device from the underside of the enclosure (1) to push upward so as to, operating in combination with the direction of curving of the spring-biasing sections (13), allow the storage device to be retrieved from the front side of the enclosure (1) thereby releasing the retained condition of the storage device (2). The retention sections (15) include a first retention member (151), a second retention member (152), and a third retention member (153) and theses retention members are arranged in an equally spaced manner and having lengths that are progressively decreased for the purposes of corresponding to the storage devices (2) of different thickness sizes. When the accommodation space (11) receives the hard disk drive A (21) to inserted therein, under the retaining engagement of the positioning sections (14) and the first retention member (151), the hard disk drive A (21) can be positioned in the left-right lateral direction. The second retention member (152) and the third retention member (153) are provided for working with a storage device (2) having a thickness between 9.5-15.0 mm in the same manner of fixing as that described previously with reference to the first retention member (151), so that repeated description will be omitted here.

Referring to FIGS. 5-8, drawings are given to respectively illustrate conditions of installation of the hard disk drive A (21), the hard disk drive B (22), the hard disk drive C (23), and the hard disk drive D (24) with respect to the supporting section (31) of the lid (3), wherein the supporting section (31) can be multiple including, sequentially from top to bottom, a first supporting section (311), a second supporting section (312), a third supporting section (313), and 1 fourth supporting section (314). When the hard disk drive A (21) is received in the accommodation space (11), the front end of the hard disk drive A (21) is in engagement with the first supporting section (311) of the lid (3) so as to stably position the hard disk drive A (21) in the enclosure (1); the hard disk drive B (22), when so received, is in engagement with the second supporting section (312) and the third supporting section (313) of the lid (3); the hard disk drive C (23), when so received, is in engagement with the fourth supporting section (314) of the lid (3); and the hard disk drive D (24), when so received, is in engagement with all the first to fourth supporting sections (311, 312, 313, 314) of the lid (3). The first supporting section (311) and the fourth supporting section (314) are each provided with a flat surface (32), so that when set in engagement with the two portions, the storage device (2) are positioned flat on the two portions. The second supporting section (312) and the third supporting section (313) are each provided with a projection surface (33), so that when set in engagement with these two portions, the storage device (2) contacts and is supported by the projection surface (33) to be fixed in position. The above arrangement illustrates that the supporting sections (31) are provided for the purposes of accommodating different thickness sizes of various hard disk drives and the supporting sections (31) are generally made of an elastic material so that the storage device (2) can be kept in tight engagement with the enclosure (1) and securely fixed in the accommodation space (11), whereby the storage device (2) is prevented from being shifted in the longitudinal direction due to external forces applied thereto and thus protecting the connector (12) and the storage device (2) from undesired damages resulting therefrom and also, dismounting and replacement of the storage device (2) can be proceeded with easily. The present invention is thus applicable to receiving different storage devices of different thickness sizes to insert and accommodate therein with a secured connection established therebetween and also allows for easy dismounting and replacement.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A fixing structure for accommodating multiple sizes of storage device, comprising:
   an enclosure, which has an interior forming an accommodation space for receiving the insertion of a storage device to be connected to and positioned by a connector arranged at an inside rear end of the enclosure, the enclosure comprising at least one spring-biasing section arranged therein in an upper portion thereof to apply a spring force to an upper surface of the storage device opposite thereto so as to position the storage device in a longitudinal direction, the enclosure comprising, in the interior thereof, a pair of positioning sections and a pair of retention sections set in left and right opposite lateral sides respectively so as to cooperate with left and right lateral sides of the storage device for positioning in a lateral direction; a lid, which comprises, on an inside surface thereof, a supporting section, wherein the lid is mountable to and thus closes a front side of the enclosure to have the supporting section in engagement with the storage device so as to have the storage device completely secured in the interior of the enclosure;
   wherein the pair of retention sections each comprises: a first retention member, a second retention member, and third retention member, which are arranged in an equally spaced manner and having lengths that are progressively decreased so that storage devices of different thickness sizes, when inserted into the accommodation space are respectively engageable with and positioned by one of the pairs of the retention members.

2. The fixing structure for accommodating multiple sizes of storage device according to claim 1, wherein the supporting section is arranged in multiplicity and includes a first supporting section, a second supporting section, a third supporting section, and a fourth supporting section, the first supporting section and the fourth supporting section each having a flat surface to correspond to storage devices of a minimum thickness and a maximum thickness, the second supporting section and the third supporting section having projection surfaces to respectively correspond to storage devices having thicknesses between the maximum thickness and the minimum thickness.

* * * * *